United States Patent
van Oort

(10) Patent No.: US 6,275,129 B1
(45) Date of Patent: Aug. 14, 2001

(54) SHIM ASSEMBLY FOR A MAGNET AND METHOD FOR MAKING

(75) Inventor: Johannes Martinus van Oort, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/427,325

(22) Filed: Oct. 26, 1999

(51) Int. Cl.[7] .................. H01F 7/00; H01F 7/02; G07V 3/00; G01R 33/20
(52) U.S. Cl. ................ 335/301; 335/303; 335/306; 324/320
(58) Field of Search .................. 335/296–306; 324/318, 319, 320; 336/177

(56) References Cited

U.S. PATENT DOCUMENTS

| | | | |
|---|---|---|---|
| 1,306,815 | * 6/1919 | Houchin et al. | 336/177 |
| 3,943,391 | * 3/1976 | Fehr | 310/103 |
| 4,127,933 | * 12/1978 | Hansen et al. | 29/605 |
| 5,297,675 | * 3/1994 | Martucci | 206/309 |
| 5,923,325 | 7/1999 | van Oort | 335/301 |

\* cited by examiner

Primary Examiner—Ramon M. Barrera
(74) Attorney, Agent, or Firm—Donald S. Ingraham; Douglas E. Stoner

(57) ABSTRACT

A shim assembly for a magnet and a method for making a shim assembly. A first spool has a shaft, a first rim attached to a first longitudinal end of the shaft, and a second rim attached to a second longitudinal end of the shaft. A first magnetizable tape has a predetermined length and is wound around the shaft longitudinally between the first and second rims.

16 Claims, 5 Drawing Sheets

SHIM ASSEMBLY FOR A MAGNET AND METHOD FOR MAKING

BACKGROUND OF THE INVENTION

The present invention relates generally to magnets, and more particularly to a shim assembly and to a method for making a shim assembly for reducing magnetic field inhomogeneity in a magnet, such as, but not limited to, a magnet having a pole piece.

Magnets include those having spaced-apart first and second pole pieces with generally opposing first and second pole faces, such as (but not limited to) "C"-shaped magnets. Some magnet applications, such as magnetic resonance imaging (MRI) for medical diagnostics, employ superconducting magnets to generate a high strength magnetic field within an imaging volume located between the pole pieces. The imaging volume must have a low magnetic field inhomogeneity for high quality imaging. Known techniques for reducing the magnetic field inhomogeneity within the imaging volume include using shimming rings attached to each pole face to reduce axisymmetric magnetic field inhomogeneity and using shims adhesively bonded to a shim tray attached to the shimming rings to reduce 3D (three-dimensional) magnetic field inhomogeneity (including non-axisymmetric inhomogeneity and any remaining axisymmetric inhomogeneity). The number, mass, and position of the shims on the pole face are determined by shimming techniques known to those skilled in the art. Adhesively bonding a shim to the shim tray is time consuming as the shim must be manually held in place, against the magnetic field, until the adhesive sets. Reshimming the magnet requires debonding the attached shim and cleaning the removed shim and the attachment area on the pole face.

U.S. Pat. No. 5,923,235 issued Jul. 13, 1999 and entitled "Shim Assembly for a Pole Piece of a Magnet" was invented by the same inventor as that of the present patent application and discloses an easily installed shim holder. The shim holder is inserted and rotated to attach it to a shim tray without the need for waiting for an adhesive bond to set. Each shim holder has holes into which shims are placed, as needed for shimming, typically by a press fit.

What is needed is a shim assembly for a magnet wherein the shim assembly provides for easier shimming of the magnet.

BRIEF SUMMARY OF THE INVENTION

In a first expression of an embodiment of the invention, a shim assembly for a magnet includes a first spool and a first magnetizable tape. The first spool has a longitudinal axis, a generally-longitudinally-extending shaft, and generally-radially-extending first and second rims. The shaft has generally-opposing first and second longitudinal ends, wherein the first rim is attached to the first longitudinal end of the shaft, and wherein the second rim is attached to the second longitudinal end of the shaft. The first magnetizable tape has a first predetermined length and is wound around the shaft longitudinally between the first and second rims.

In a second expression of an embodiment of the invention, a shim assembly for a pole face of a magnet includes a non-magnetizable shim tray, a first non-magnetizable spool, and a first magnetizable tape. The pole face of the magnet has a longitudinal axis. The shim tray is positioned near the pole face. The shim tray has at least two generally-circular surface holes each having an axis generally parallel to the longitudinal axis, each having an opening facing away from the pole face, and each having a circumferential flat portion located only longitudinally near the opening. The first non-magnetizable spool is positioned in a first one of the surface holes, has an axis generally parallel to the longitudinal axis, has a generally-longitudinally-extending and generally-circular-cylindrical-shaped shaft, and has generally-identical, generally-radially-extending, and generally-circular-shaped first and second rims. The shaft has generally-opposing first and second longitudinal ends, wherein the first rim is attached to the first longitudinal end of the shaft and has a first circumferential flat region generally matching in shape the circumferential flat portion, and wherein the second rim is attached to the second longitudinal end of the shaft and has a second circumferential flat region generally aligned with the first circumferential flat region and generally matching in shape the circumferential flat portion. The first magnetizable tape has a first predetermined length and is wound around the shaft longitudinally between the first and second rims.

In a first expression of a method of the invention for making a shim assembly for a magnet, steps include obtaining a first spool, obtaining a first magnetizable tape, and determining a first length of the first magnetizable tape that provides a predetermined shim strength. Other steps include winding the first magnetizable tape on the first spool and cutting the wound first magnetizable tape to the determined first length.

In a second expression of a method of the invention for making a shim assembly for a magnetic resonance imaging (MRI) magnet, steps include obtaining a first non-magnetizable plastic spool, obtaining a first magnetizable tape including a magnetizable foil layer and a pressure-sensitive-adhesive-tape layer attached to the magnetizable foil layer, and determining a first length of the first magnetic tape that provides a predetermined shim strength. Other steps include winding the first magnetizable tape on the first spool and cutting the wound first magnetizable tape to the determined first length.

Several benefits and advantages are derived from the invention. Cutting the magnetizable tape to an exact determined length provides a spool (shim holder) which more accurately achieves a desired predetermined shim strength than do prior techniques which place a number of shims of limited discrete sizes in a shim holder. Predetermining a shim strength for a shim holder is more easily done when the shim is a magnetizable tape wound as a cylinder on a shim holder having the shape of a spool. This is so because determining the shim strength of a cylinder is more easily done than determining the shim strengths of a number of shims in a prior shim holder due to the magnetic interaction of the shims in the prior shim holder. Winding a magnetic tape on a spool is less labor intensive than the prior technique of manually press-fitting shims of different sizes into particular ones of available holes in a shim holder.

DETAILED DESCRIPTION OF THE INVENTION

Figure 1:
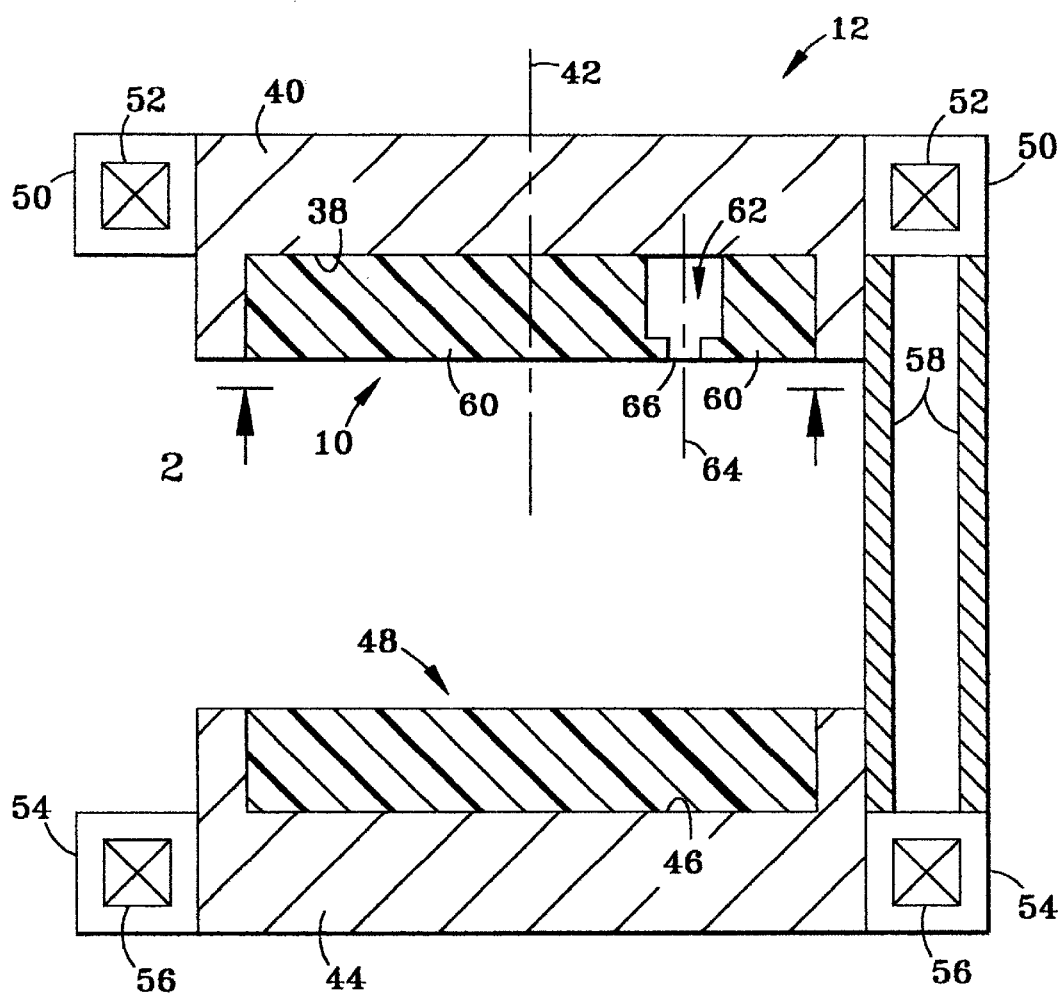
FIG. 1 is a schematic cross sectional view of an embodiment of the shim assembly of the invention shown attached to a pole face of a magnet, wherein, for clarity, only a first one of the surface holes of the shim tray is shown and wherein the first one of the surface holes is shown devoid of a spool.

Referring now to the drawings, wherein like numerals represent like elements throughout, FIGS. 1–10 show an embodiment of the shim assembly 10 of the present invention.

In a first expression of the shown embodiment of the invention, the shim assembly 10 is for a magnet 12, and the shim assembly 10 includes a first spool 14 and a first magnetizable tape 16. By "magnetizable" is meant having a relative permeability larger than generally unity. "Relative permeability" is the ratio of magnetic flux density produced in a material to the value in free space produced by the same magnetic field strength. Examples of magnetizable materials include low carbon steel, permanent magnets, etc. The first spool 14 has a longitudinal axis 18 (also just called an axis 18), a generally-longitudinally-extending shaft 20, and generally-radially-extending first and second rims 22 and 24. The shaft 20 has generally-opposing first and second longitudinal ends 26 and 28, wherein the first rim 22 is attached to the first longitudinal end 26 of the shaft 20, and wherein the second rim 24 is attached to the second longitudinal end 28 of the shaft 20. The shaft 20 and the first and second rims 22 and 24 can together define a monolithic first spool, or the first spool can otherwise be constructed. Alternate constructions include a monolithic shaft 20 and first rim 22 unit onto which the second rim 24 is attached by a press-fit, etc., and such alternate constructions are left to the artisan. The first magnetizable tape 16 has a first predetermined length and is wound around the shaft 20 longitudinally between the first and second rims 22 and 24.

Figure 8:
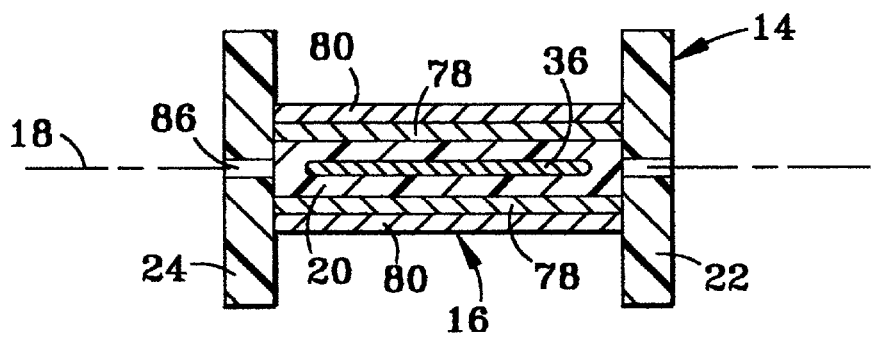
FIG. 8 is a cross-sectional view of the spool of FIG. 7 which also includes a first magnetizable tape wound on the first spool.
Figure 10:
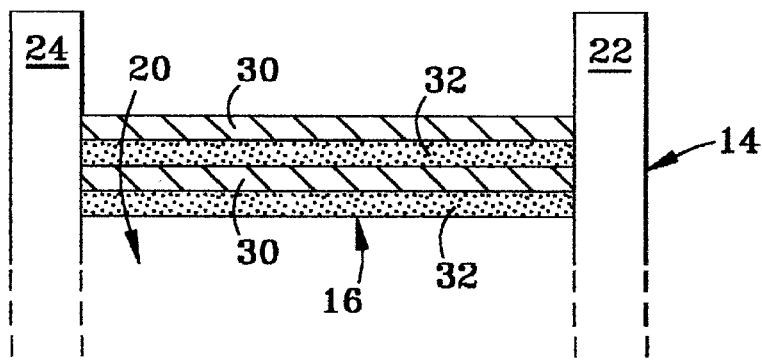
FIG. 10 is an enlarged view of a portion of FIG. 8 showing that the first magnetizable tape includes a magnetizable foil layer and a pressure-sensitive-tape-layer attached to the magnetizable foil layer.

In one example of this expression of the shown embodiment of the invention, the first spool 14 is a first non-magnetizable spool 14. By "non-magnetizable" is meant having a relative permeability equal to generally unity. Examples of nonmagnetizable materials include aluminum, copper, non-magnetic stainless steel, plastic, wood, etc. In another example, as seen in FIG. 10, the first magnetizable tape 16 includes a magnetizable foil layer 30 and a pressure-sensitive-adhesive-tape layer 32 attached to the magnetizable foil layer 30. Here, a portion of the pressure-sensitive-adhesive-tape layer 32 is attached by pressure adhesion to the shaft 20. In one construction, the first non-magnetizable spool 14 consists essentially of plastic (such as NORYL-731 plastic), and the first magnetizable tape 16 consists essentially of a pressure-sensitive-adhesive-backed steel-foil tape such as a low-carbon steel foil backed by a Kapton® pressure sensitive tape. In one design, the shaft 20 has a generally-longitudinally-extending surface slot 34 (seen in FIG. 7), and the first magnetizable tape 16 has a first end 36 disposed in the surface slot 34 of the shaft 20 (as seen in FIG. 8). In another design, the shaft 20 has a shape of generally a circular cylinder, and the first and second rims 22 and 24 each have a generally identical shape of a generally circular disk. In one example, the first spool 14 has a longitudinal height of generally 7.5 millimeters and a diameter between generally 25 and 40 millimeters, and the first magnetizable tape 16 has a width of generally 5.5 millimeters, with the magnetizable foil layer 30 having a thickness of generally 1 millimeter and with the pressure-sensitive-adhesive-tape-layer 32 having a thickness of generally 0.5 millimeter.

In a second expression of the shown embodiment of the invention, the shim assembly 10 is for a pole face 38 of a pole piece 40 of a magnet 12, wherein the pole face 38 has a longitudinal axis 42. Table MRI (magnetic resonance imaging) magnet designs (not shown) are known that have only one pole face. However, typically the magnet 12 will include a second opposing and generally identical pole piece 44 with a generally identical pole face 46 and a second shim assembly 48. The second shim assembly 48 is generally identical to the first shim assembly 10 but typically with different determined lengths of magnetizable tape wound on spools disposed in a different subset of surface holes of the pole face 46 of the second pole piece 44. Other known magnet designs (not shown) have additional pole pieces with additional pole faces which would receive additional shim assemblies as can be appreciated by those skilled in the art. It is noted that the shim assembly 10 is not limited to magnets having pole pieces, and the shim assembly of the invention can be for any magnet, as can be appreciated by the artisan. For purposes of illustration, the magnet 12 shown in FIG. 1 will be described as a superconductive magnetic resonance imaging (MRI) magnet having an imaging volume located between the pole faces 38 and 46 and typically centered on the longitudinal axis 42, but it is understood that the shim assembly 10 of the invention can be used for any magnet and is not limited to a superconductive magnet or to a magnet which is part of an MRI imaging system. For instance, the shim assembly 10 can be used in open geometry-type magnet and also can be used in drawer-type shim systems of cylindrical magnets.

In one example of a magnet having a pole face, the magnet 10 includes a vacuum enclosure 50 containing a superconductive coil 52 and surrounding the pole piece 40 and includes a second vacuum enclosure 54 containing a second superconductive coil 56 and surrounding the second pole piece 44. Coil supports, additional superconductive coils, (including main, bucking, and shielding coils) and one or more thermal shields, all omitted from the figures for clarity, may be disposed within the vacuum enclosures 50 and 54 as is known to the artisan. The superconductive coils may be cooled by a liquid cryogen (e.g., liquid helium) and/or by a cryocooler coldhead, such cooling not shown and being known to those skilled in the art. A non-magnetizable support member 58 (such as a non-magnetic stainless steel support member) connects the pole piece 40 and the vacuum enclosure 50 with the second pole piece 44 and the second vacuum enclosure 54.

The shim assembly 10, in the second expression of the shown embodiment of the invention, includes a non-magnetizable shim tray 60. The shim tray 60 is disposed proximate the pole face 38 and in one example is attached to the pole face 38. Such attachment may occur during pole face manufacture or such attachment may occur to retrofit an existing pole face with a shim assembly. Such attachment includes suitable bolting, adhesive bonding, and the like, as is known to the artisan. It is noted that the shim tray may be attached, alternatively, to the support member, elsewhere on the pole piece, or even to the floor, etc. The shim tray 60 has a plurality of generally circular surface holes 62 each having an axis 64 generally parallel to the longitudinal axis 42 of the pole face 38, each having an opening 66 facing away from the pole face 38, and each having a circumferential flat portion 68 disposed only longitudinally proximate the opening 66.

Figure 9:
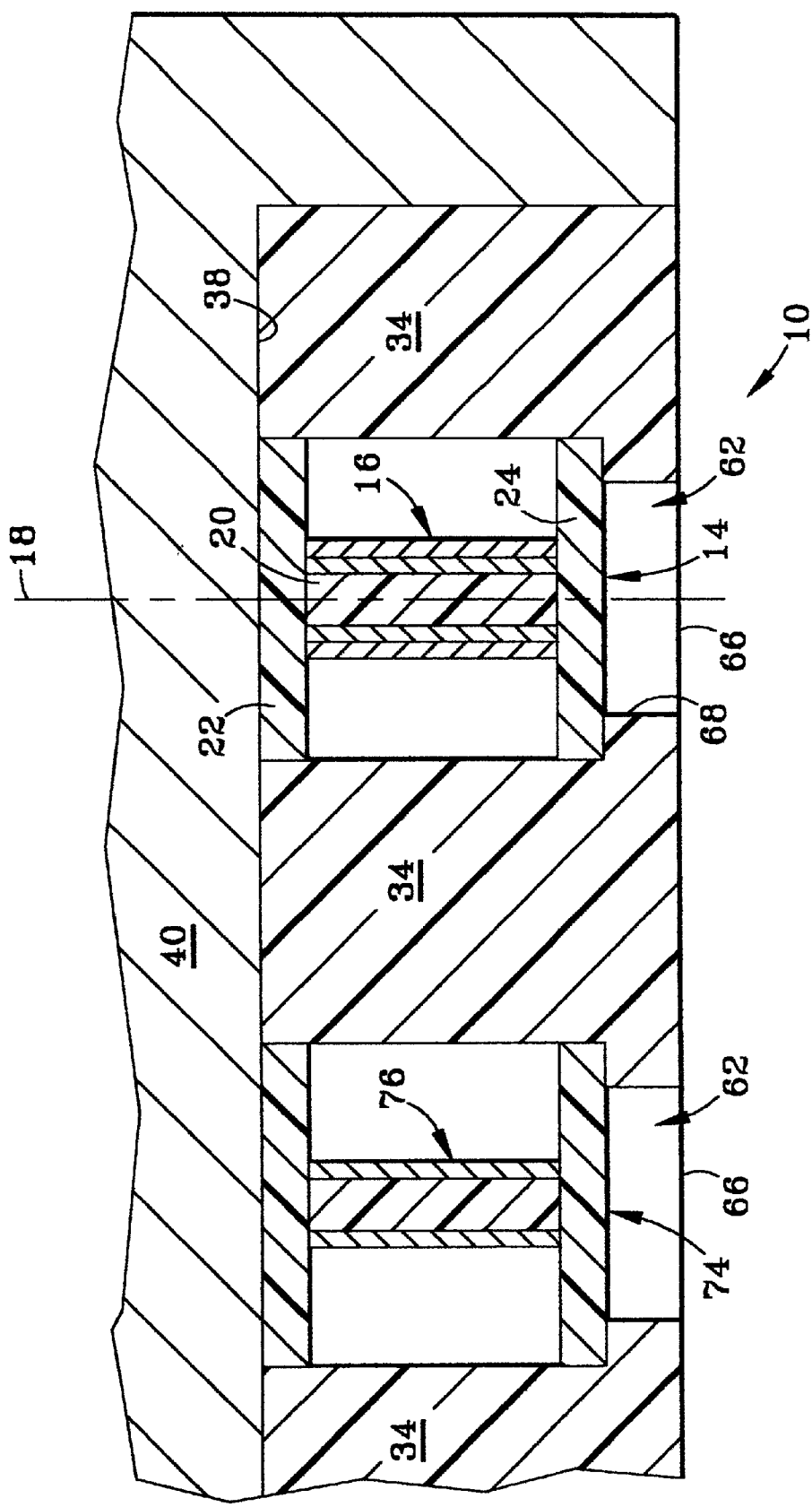
FIG. 9 is a view, as in FIG. 3, also showing a second surface hole with a first spool installed in a first one of the surface holes and with a second spool installed in a second one of the surface holes.

The shim assembly 10, in the second expression of the shown embodiment of the invention, also includes a first non-magnetizable spool 14 and a first magnetizable tape 16. As seen in FIG. 9, the first non-magnetizable spool 14 is disposed in a first one of the surface holes 62. The first non-magnetizable spool 14 has an axis 18 generally parallel to the longitudinal axis 42 of the pole face 38, has a generally-longitudinally-extending and generally-circular-cylindrical-shaped shaft 20, and has generally-identical, generally-radially-extending, and generally-circular-shaped first and second rims 22 and 24. The shaft 20 has generally-opposing first and second longitudinal ends 26 and 28. The first rim 22 is attached to the first longitudinal end 26 of the shaft 20 and has a first circumferential flat region 70 generally matching in shape the circumferential flat portion 68 of the surface hole 62. The second rim 24 is attached to the second longitudinal end 28 of the shaft 20 and has a second circumferential flat region 72 generally aligned with the first circumferential flat region 70 and generally matching in shape the circumferential flat portion 68 of the surface hole 62. The first magnetizable tape 16 has a first predetermined length and is wound around the shaft 20 longitudinally between the first and second rims 22 and 24.

In one design of this expression of the shown embodiment of the invention, the shim assembly 10 also includes a second non-magnetizable spool 74 generally identical to the first non-magnetizable spool 14 and further including a second magnetizable tape 76 generally identical to the first magnetizable tape 16 but having a second predetermined length different from the first predetermined length. The second magnetizable tape 76 is wound around the shaft of the second non-magnetizable spool 74 longitudinally between the first and second rims of the second non-magnetizable spool 74. The second non-magnetizable spool 74 is disposed in a second one of the surface holes 62, as seen in FIG. 9.

In one example of this expression of the shown embodiment of the invention, as seen in FIG. 10, the first magnetizable tape 16 includes a magnetizable foil layer 30 and a pressure-sensitive-adhesive-tape layer 32 attached to the magnetizable foil layer 30. Here, a portion of the pressure-sensitive-adhesive-tape layer 32 is attached by pressure adhesion to the shaft 20. In one construction, the first non-magnetizable spool 14 consists essentially of plastic, and the first magnetizable tape 16 consists essentially of a pressure-sensitive-adhesive-backed steel-foil tape such as a low-carbon steel foil backed by a Kapton® pressure sensitive tape. In one design, the shaft 20 has a generally-longitudinally-extending surface slot 34 (seen in FIG. 7), and the first magnetizable tape 16 has a first end 36 disposed in the surface slot 34 of the shaft 20 (as seen in FIG. 8). In another design, the shim assembly 10 includes a second non-magnetizable spool 74 and a second magnetizable tape 76, as previously mentioned in the description of the first expression of the shown embodiment of the invention.

A first expression of a method of the invention is for making a shim assembly 10 for a magnet 12 and includes steps a) through e). Step a) includes the step of obtaining (or providing) a first spool 14, step b) includes the step of obtaining (or providing) a first magnetizable tape 16, and step c) includes the step of determining a first length of the first magnetizable tape 16 that provides a predetermined shim strength. There are techniques known to the artisan for calculating required shim strength and shim placement within constraints of a shim assembly design, such constraints including available shim shapes, available shim strengths, and available shim locations. Thus, one skilled in the art can determine which surface holes 62 of the shim tray 60 need spools 14 and 74, and for such spools, the required length of the magnetizable tape 16 and 76 to be wound on each spool 14 and 74. Step d) includes the step of winding the first magnetizable tape 16 on the first spool 14. Step e) includes the step of cutting the wound first magnetizable tape 16 to the determined first length of step c).

In one technique, step a) includes obtaining (or providing) a first non-magnetizable spool 14. In another technique, step b) includes obtaining a first magnetizable tape 14 comprising a magnetizable foil layer 30 and a pressure-sensitive-adhesive-tape layer 32 attached to the magnetizable foil layer 30. In a further technique, step d) includes winding the first magnetizable tape 16 on the first spool 14 such that a first portion of the pressure-sensitive-adhesive-tape layer 32 is attached by pressure-adhesion to the shaft 20. It is noted that, as appropriate, robots can be employed to perform steps of the method of the invention.

A second expression of a method of the invention is for making a shim assembly 10 for a magnetic resonance imaging (MRI) magnet 12 and includes steps a) through e). Step a) includes the step of obtaining (or providing) a first non-magnetizable plastic spool 14, step b) includes the step of obtaining (or providing) a first magnetizable tape 16 which includes a magnetizable foil layer 30 and a pressure-sensitive-adhesive-tape layer 32 attached to the magnetizable foil layer 30, and step c) includes the step of determining a first length of the first magnetizable tape 16 that provides a predetermined shim strength. Step d) includes the step of winding the first magnetizable tape 16 on the first spool 14. Step e) includes the step of cutting the wound first magnetizable tape 16 to the determined first length of step c).

Figure 11:
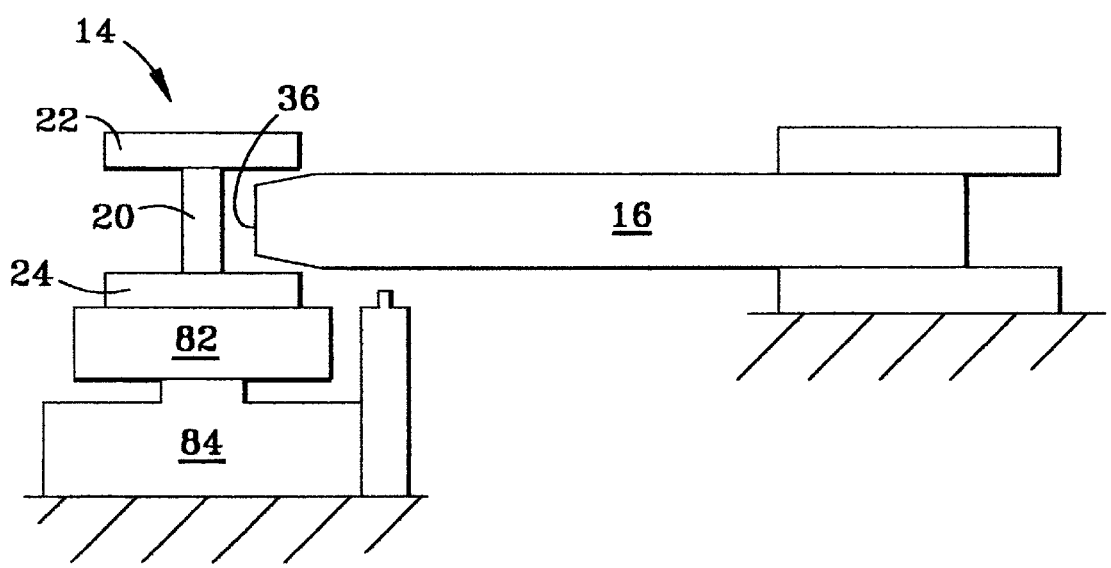
FIG. 11 is a schematic view of a first magnetizable tape about to be wound on a first spool.

In one technique, step d) includes winding at least a first and a second stratum 78 and 80 of the first magnetizable tape 16 on the first spool 14. In another technique, step d) includes winding the first magnetizable tape 16 such that a first portion of the pressure-sensitive-adhesive-tape layer 32 of the first magnetizable tape 16 of the first stratum 78 is attached by pressure-adhesion to the shaft 20 and such that a second portion of the pressure-sensitive-adhesive-tape layer 32 of the first magnetizable tape 16 of the second stratum 80 is attached by pressure-adhesion to the magnetizable foil layer 30 of the first magnetizable tape 16 of the first stratum 78. In a further technique, suggested by FIG. 11, step d) includes disposing the first non-magnetizable spool 14 on a drive wheel 82 of a step motor 84, attaching a first end 36 of the first magnetizable tape 16 to the first nonmagnetizable spool 14, and commanding the step motor 84 to rotate the drive wheel 82 a predetermined number of angular steps corresponding to the determined first length.

Figure 4:
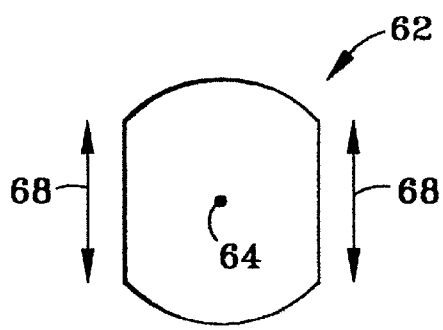
FIG. 4 is a view of the perimeter of a first portion of the surface hole of FIG. 3 taken along lines 4—4 of FIG. 3, such first portion being longitudinally proximate the opening of the surface hole.
Figure 5:
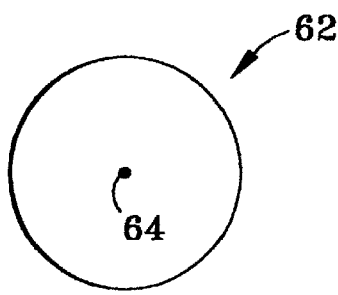
FIG. 5 is a view of the circumference of a second portion of the surface hole of FIG. 3 taken along lines 5—5 of FIG. 3, such second portion being longitudinally distant the opening of the surface hole.
Figure 6:
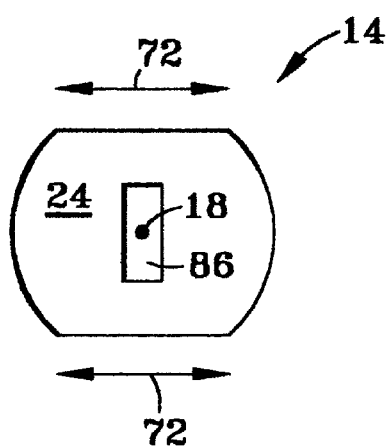
FIG. 6 is a schematic side elevational view of an empty first spool.
Figure 7:
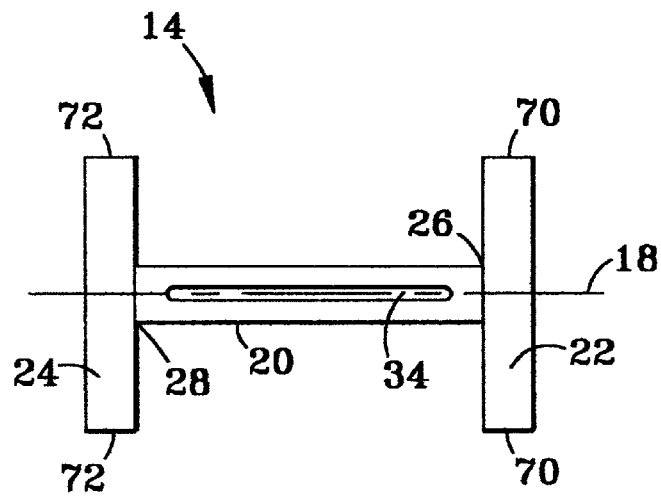
FIG. 7 is a schematic front elevational view of the empty first spool of FIG. 6.

The first spool 14 is installed in the first one of the surface holes 62 of the shim tray 60 by first aligning the first circumferential flat region 70 (or regions, if more than one) of the first rim 22 of the first spool 14 with the circumferential flat portion 68 (or portions, if more than one, such as the two portions 68 shown in FIG. 4) of the first one of the surface holes 62 of the shim tray 60. It is noted that the second circumferential flat region 72 (or regions, if more than one, such as the two regions 72 shown in FIG. 6) of the second rim 24 is aligned with the first circumferential flat region 70 of the first rim 22, and that the first and second circumferential flat regions 70 and 72 of the first and second rims 22 and 24 match in shape the circumferential flat portion 68 of the first one of the surface holes 62. Next, the first spool 14 is longitudinally inserted (by using, for example, a tweezer-like tool, not shown, inserted into a keyhole slot 86 in the second rim 24 of the first spool 14), first rim 22 first, into the first one of the surface holes 62 of the shim tray 60 until the second rim 24 of the first spool 14 clears the longitudinal length of the circumferential flat portion 68 of the first one of the surface holes 62 of the shim tray 60 (such circumferential flat portion 68 being disposed only longitudinally proximate the opening 66 of the first one of the surface hole 62). Then, the first spool 14 is secured in the first one of the surface holes 62 by rotating the first spool 14 (by using, for example, the previously-mentioned tweezer-like tool inserted into the keyhole slot 86 in the second rim 24 of the first spool 14) such that the second circumferential flat region 72 is misaligned with the circumferential flat portion 68 of the first one of the surface holes 62.

Figure 2:
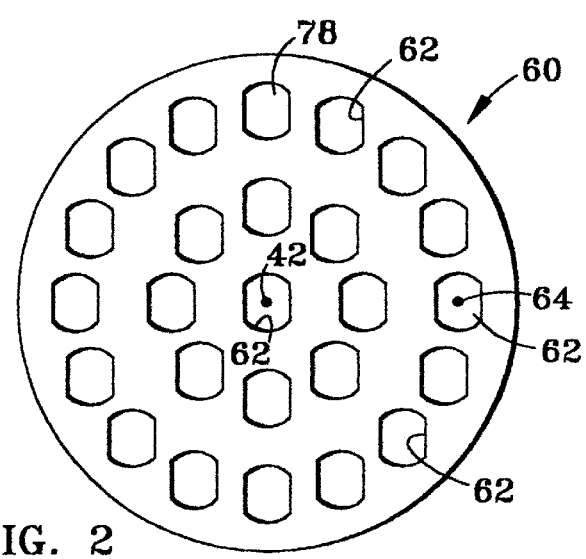
FIG. 2 is a schematic top planar view of the pole face of FIG. 1 taken along lines 2—2 of FIG. 1 showing many surface holes.
Figure 3:
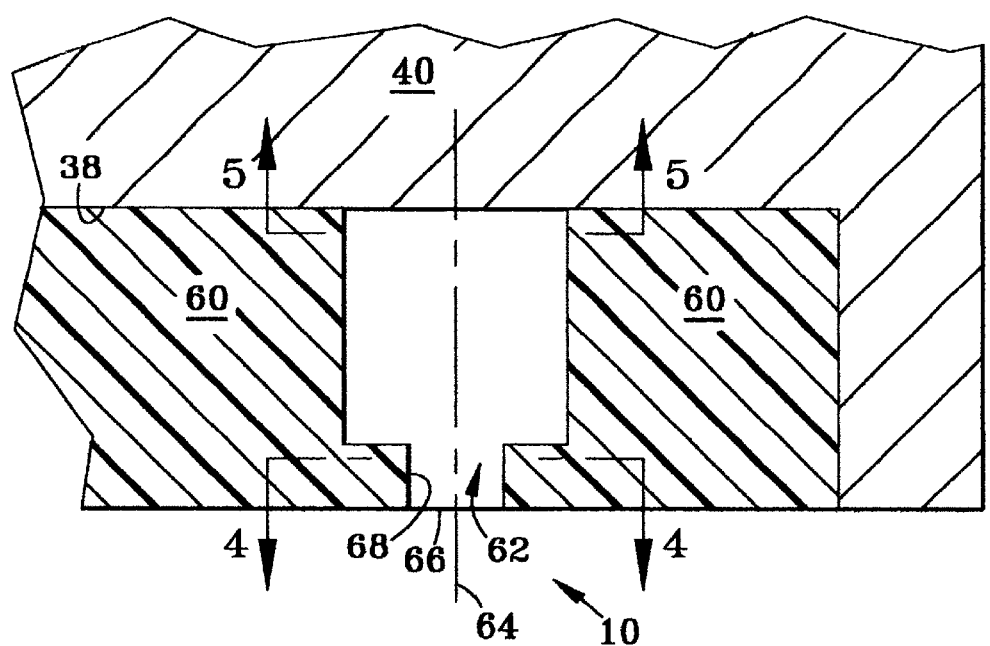
FIG. 3 is an enlarged view of the surface hole portion of FIG. 1.

It is noted that the pole piece 40 may, without limitation, be solid iron or have a solid iron substrate covered with alternating amorphous steel and epoxy laminations. In one construction, the shim tray 60 comprises FRP (a fiber reinforced plastic such as a glass fiber epoxy) with the surface holes 62 created by a plug which is removed after the epoxy has cured, as can be appreciated by the artisan. In a typical construction, the surface holes 62 are (but need not be) generally identical and are generally axisymmetricaly arrayed about the longitudinal axis 42 of the pole face 38, as seen in FIG. 2. It is pointed out that non-identical spools (of different sizes and shapes, etc.) would be employed in non-identical surface holes, with a particular spool matching (in size and shape, etc.) a particular surface hole. It is noted that the shim tray 60 may be manufactured with the pole piece 40 or may be retrofitted to an existing pole piece 40, as can be appreciated by the artisan.

Several benefits and advantages are derived from the invention. Cutting the magnetizable tape to an exact determined length provides a spool (shim holder) which more accurately achieves a desired predetermined shim strength than do prior techniques which place a number of shims of limited discrete sizes in a shim holder. Predetermining a shim strength for a shim holder is more easily done when the shim is a magnetizable tape wound as a cylinder on a shim holder having the shape of a spool. This is so because determining the shim strength of a cylinder is more easily done than determining the shim strengths of a number of shims in a prior shim holder due to the magnetic interaction of the shims in the prior shim holder. Winding a magnetic tape on a spool is less labor intensive than the prior technique of manually press-fitting shims of different sizes into particular ones of available holes in a shim holder.

The foregoing description of several expressions of a shown embodiment and a method of the invention have been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A shim assembly for a pole face of a magnet, said pole face having a longitudinal axis, and said shim assembly comprising:

a) a non-magnetizable shim tray disposed proximate said pole face, wherein said non-magnetizable shim tray has a plurality of generally-circular surface holes each having an axis generally parallel to said longitudinal axis, each having an opening facing away from said pole face, and each having a circumferential flat portion disposed only longitudinally proximate said opening;

b) a first non-magnetizable spool disposed in a first one of said surface holes, having an axis generally parallel to said longitudinal axis, having a generally-longitudinally-extending and generally-circular-cylindrical-shaped shaft, and having generally-identical, generally-radially-extending, and generally-circular-shaped first and second rims, wherein said shaft has generally-opposing first and second longitudinal ends, wherein said first rim is attached to said first longitudinal end of said shaft and has a first circumferential flat region generally matching in shape said circumferential flat portion, and wherein said second rim is attached to said second longitudinal end of said shaft and has a second circumferential flat region generally aligned with said first circumferential flat region and generally matching in shape said circumferential flat portion; and c) a first magnetizable tape having a first predetermined length and wound around said shaft longitudinally between said first and second rims.

2. The shim assembly of claim 1, also including a second non-magnetizable spool generally identical to said first non-magnetizable spool and further including a second magnetizable tape generally identical to said first magnetizable tape but having a second predetermined length different from said first predetermined length, wherein said second magnetizable tape is wound around said shaft of said second non-magnetizable spool longitudinally between said first and second rims of said second non-magnetizable spool, and wherein said second non-magnetizable spool is disposed in a second one of said surface holes.

3. The shim assembly of claim 1, wherein said first magnetizable tape comprises a magnetizable foil layer and a pressure-sensitive-adhesive-tape layer attached to said magnetizable foil layer, and wherein a portion of said pressure-sensitive-adhesive-tape layer is attached by pressure-adhesion to said shaft.

4. The shim assembly of claim 3, wherein said shaft has a generally-longitudinally-extending surface slot, and wherein said first magnetizable tape has a first end disposed in said surface slot of said shaft.

5. The shim assembly of claim 4, wherein said first non-magnetizable spool consists essentially of plastic, and wherein said first magnetizable tape consists essentially of an adhesive-backed steel-foil tape.

6. The shim assembly of claim 4, also including a second non-magnetizable spool generally identical to said first non-magnetizable spool and further including a second magnetizable tape generally identical to said first magnetizable tape but having a second predetermined length different from said first predetermined length, wherein said second magnetizable tape is wound around said shaft of said second non-magnetizable spool longitudinally between said first and second longitudinal ends of said shaft of said second non-magnetizable spool, and wherein said second non-magnetizable spool is disposed in a second one of said surface holes.

7. A method for making a shim assembly for a magnetic resonance imaging (MRI) magnet, said method comprising the steps of:
   a) obtaining a first non-magnetizable plastic spool;
   b) obtaining a first magnetizable tape including a magnetizable foil layer and a pressure-sensitive-adhesive-tape layer attached to said magnetizable foil layer;
   c) determining a first length of said first magnetizable tape that provides a predetermined shim strength;
   d) winding said first magnetizable tape on said first non-magnetizable plastic spool; and
   e) cutting said wound first magnetizable tape to said determined first length.

8. The method of claim 7, wherein step d) includes winding at least a first and a second stratum of said first magnetizable tape on said first non-magnetizable plastic spool.

9. The method of claim 8, wherein step d) includes winding said first magnetizable tape such that a first portion of said pressure-sensitive-adhesive-tape layer of said first magnetizable tape of said first stratum is attached by pressure-adhesion to said shaft and such that a second portion of said pressure-sensitive-adhesive-tape layer of said first magnetizable tape of said second stratum is attached by pressure-adhesion to said magnetizable foil layer of said first magnetizable tape of said first stratum.

10. The method of claim 9, wherein step d) includes disposing said first non-magnetizable plastic spool on a drive wheel of a step motor, attaching a first end of said first magnetizable tape to said first non-magnetizable plastic spool, and commanding said step motor to rotate said drive wheel a predetermined number of angular steps corresponding to said determined first length.

11. A shim assembly for a magnet, said shim assembly comprising:
   a) at least one spool having a generally-longitudinally-extending shaft, wherein said spool is a non-magnetizable spool;
   b) at least one magnetizable tape having a respective predetermined length and wound around said spool, wherein said magnetizable tape comprises a magnetizable foil layer and a pressure sensitive-adhesive-tape layer attached to said magnetizable foil layer, and wherein a portion of said pressure-sensitive-adhesive-tape layer is attached by pressure-adhesion to said shaft; and
   c) a shim tray having a plurality of cavities, wherein said at least one spool is disposed in a selected one of said cavities so as to position said spool in a spaced relationship with said magnet when said shim tray is positioned in juxtaposition with said magnet as part of said shim assembly.

12. The shim assembly of claim 11, wherein said shaft has a generally longitudinally-extending surface slot, and wherein said magnetizable tape has a first end disposed in said surface slot of said shaft.

13. The shim assembly of claim 12, wherein said shaft has a shape of generally a circular cylinder, and wherein said shaft has a first and second rims each having a generally identical shape of a generally circular disk.

14. The shim assembly of claim 13 wherein said at least one non-magnetizable spool consists essentially of plastic, and wherein said at least one magnetizable tape consists essentially of an pressure-sensitive-adhesive-backed steel-foil tape.

15. A method for making a shim assembly for a magnet, said method comprising the steps of:
   a) obtaining at least one spool having a generally-longitudinally-extending shaft, wherein said spool is a non-magnetizable spool;
   b) preparing at least one magnetizable tape, said tape being selected to provide a predetermined shim strength, wherein said magnetizable tape comprises a magnetizable foil layer and a pressure-sensitive-adhesive-tape layer attached to said magnetizable foil layer;
   c) winding said at least one magnetizable tape on said at least one spool; and
   d) assembling said at least one spool in a shim tray having a plurality of cavities, wherein said at least one spool is disposed in one of said cavities so as to affect the magnetic field generated by said magnet.

16. The method of claim of claim 15, wherein step c) includes winding said at least one magnetizable tape on said at least one spool such that a first portion of said pressure-sensitive-adhesive-tape layer is attached by pressure-adhesion to said shaft.

* * * * *